United States Patent [19]

Mitsumori et al.

[11] Patent Number: 4,463,084
[45] Date of Patent: Jul. 31, 1984

[54] METHOD OF FABRICATING A CIRCUIT BOARD AND CIRCUIT BOARD PROVIDED THEREBY

[75] Inventors: Ken'ichi Mitsumori, Miyagi; Kazuo Aikawa, Kashimadai, both of Japan

[73] Assignee: Alps Electric Co., Ltd., Tokyo, Japan

[21] Appl. No.: 430,601

[22] Filed: Sep. 30, 1982

[30] Foreign Application Priority Data

Feb. 9, 1982 [JP] Japan .................................. 57-19212
Feb. 17, 1982 [JP] Japan .................................. 57-24176

[51] Int. Cl.³ .............................................. G03C 5/00
[52] U.S. Cl. ................................... 430/315; 430/312; 430/313; 430/314; 430/318; 430/319; 204/15; 204/38 A; 204/37.6
[58] Field of Search ............... 430/312, 313, 314, 315, 430/318, 319, 320; 204/12, 15, 35 N, 38 A, 42; 156/664

[56] References Cited

U.S. PATENT DOCUMENTS

| | | | |
|---|---|---|---|
| 2,884,571 | 4/1959 | Hannahs | 204/12 |
| 3,424,658 | 1/1969 | Norton | 204/15 |
| 3,805,023 | 4/1974 | Wainer et al. | 219/543 |
| 4,021,592 | 5/1977 | Fromson | 428/209 |
| 4,225,398 | 9/1980 | Hasegawa et al. | 204/33 |
| 4,293,617 | 10/1981 | Nagy | 428/469 |
| 4,307,147 | 12/1981 | Ohishi et al. | 428/268 |

OTHER PUBLICATIONS

T. Saji et al., "Coloring of Anodized Al by AC Electrolysis in CuSO₄ Solution," Plating and Surface Finishing, Nov. 1979, pp. 40-43.

Primary Examiner—John E. Kittle
Assistant Examiner—José G. Dees
Attorney, Agent, or Firm—Guy W. Shoup; Gerard F. Dunne

[57] ABSTRACT

A circuit board such as a code disk having a smooth contact surface and a minute pattern is fabricated by depositing an alumite film on an aluminum and selectively filling electrically nonconductive and conductive materials in the cells in the crystals of the alumite film.

6 Claims, 16 Drawing Figures 4,463,084

METHOD OF FABRICATING A CIRCUIT BOARD AND CIRCUIT BOARD PROVIDED THEREBY

BACKGROUND OF THE INVENTION

The present invention relates to a method of fabricating a circuit board, and more particularly to a method of fabricating of an electric circuit board having a smooth contact surface and a minute circuit pattern.

It has been a customary practice to employ thick-film and thin-film technologies such as printing and vacuum evaporation and a transfer process for fabricating a code disk for a contact encoder by forming on an insulating substrate a minute circuit pattern having a smooth surface for contact with contactors. The circuit pattern has a minimum pattern width of 100 microns or smaller, and the code disk is required to withstand one million cycles or more of operation while in sliding contact with a contactor. The vacuum evaporation process for fabricating such a circuit board is complex and costly. In addition, conventional code disks thus formed are of a relatively short service life as the circuit pattern is made of thin film.

SUMMARY OF THE INVENTION

Accordingly, it is an object of the present invention to provide a method of fabricating a circuit board of a longer service life having a minute circuit pattern by utilizing an alumite coating having cells which is deposited on an aluminum substrate.

According to the present invention, a circuit board is made by depositing a photosensitive resin film on an alumite film composed of crystals having pores or open cells, depositing a photosensitive resin film on the alumite film, removing portions of the photosensitive resin film to form a negative pattern of a desired circuit configuration, filling an electrically nonconductive material in the cells in the alumite film in the negative pattern, removing the remaining photosensitive resin film from the alumite film, and filling an electrically conductive material in the remaining empty cells in the alumite film. The method further includes, subsequent to the filling step, the steps of depositing a photosensitive resin film on another surface of the aluminum substrate which is opposite to the surface on which the alumite film has been deposited, photoetching the photosensitive resin film deposited in the last-mentioned depositing step and the another surface of the aluminum substrate to remove portions thereof in a pattern aligned with the negative pattern, removing the remaining photosensitive resin film, and filling an electrically nonconductive material in the pattern formed on the aluminum substrate in the photoetching step.

The above and other objects, features and advantages of the present invention will become more apparent from the following description when taken in conjunction with the accompanying drawings in which a preferred embodiment of the present invention is shown by way of illustrative example.

DETAILED DESCRIPTION

Figure 1A:
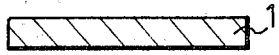
FIGS. 1A through 1P are fragmentary cross-sectional views illustrative of successive steps of a method according to the present invention.
Figure 1B:
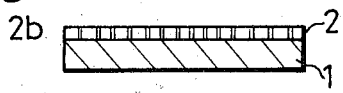
Figure 2:
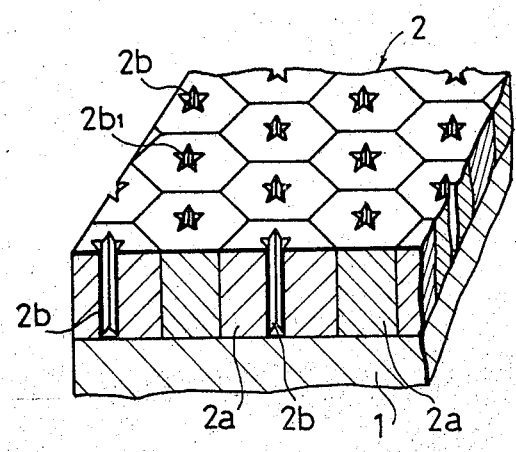
FIG. 2 is an enlarged fragmentary perspective view of an alumite film.

As shown in FIGS. 1A and 1B, an aluminum substrate 1 is coated with an alumite film 2 by an anode oxidation method in which the aluminum substrate serves as an anode and is oxidized by way of electrolysis in an aqueous solution of electrolyte such as nitric acid. As is well known in the art, the alumite film 2 thus formed by the anode oxidation method is composed of a porous oxidized coating, which, as shown in FIG. 2, comprises a multiplicity of minute polygonal crystals 2a arranged closely together. Each of the crystals 2a has a smaller cell 2b having a maximum dimension of 300 angstrom and extending down to the aluminum substrate 1.

Figure 1C:
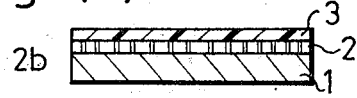
Figure 1D:
Figure 1E:
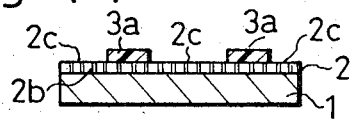
Figure 1F:
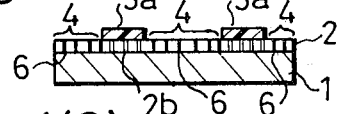
Figure 1G:
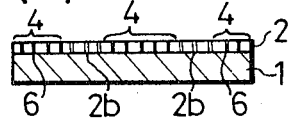
Figure 1H:
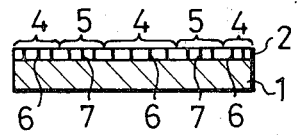
Figure 3:
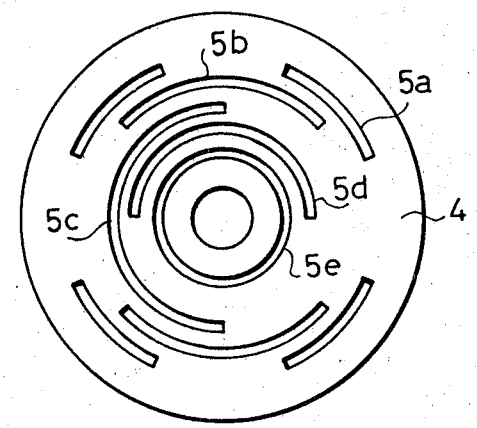
FIG. 3 is a plan view of a code disk fabricated according to a method of the present invention.

In FIG. 1C, the alumite film 2 is then coated with a photoresist or a film 3 of a photosensitive acrylic resin such as Riston manufactured by E. I. DuPont. As shown in FIGS. 1D and 1E, unnecessary portions of the photosensitive resin film 3 are removed by a photoresist removal process, thereby providing a negative pattern 2c of a desired circuit configuration on the alumite film 2 as defined by remaining film portions 3a, 3a. In FIG. 1F, the cells 2b in the crystals 2a of the alumite film 2 in the negative pattern 2c are filled with masses 6 of an electrically nonconductive material such as molybdenum disulfide ($MOS_2$). This filling step is carried out by electrolyzing the aluminum substrate 1 having the aluminum film 2 thereon in an aqueous solution of ammonium tetrathiomolybdate to form an insulating layer 4 of molybdenum disulfide in the cells 2b in the alumite film 2. Then, as shown in FIG. 1G, the remaining portions 3a of photosensitive resin film are chemically or mechanically removed off by a solution of methylene chloride or a buff. In FIG. 1H, the remaining empty cells 2b in the crystals 2a of the alumite film 2 are filled by plating with masses 7 as of gold until the masses 7 slightly project out beyond upper ends $2b_1$ (FIG. 2) of the cells 2b. Thus, an electrically conductive layer 5 composed of contact electrodes 5a, 5b, 5c, 5d, 5e as shown in FIG. 3 and the electrically nonconductive layer 4 are formed in the alumite film 2.

Figure 1J:
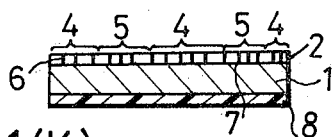
Figure 1K:
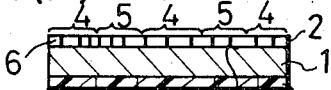
Figure 1L:
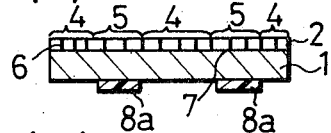
Figure 1M:
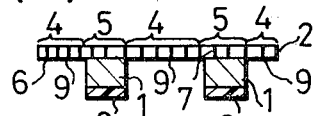
Figure 1N:
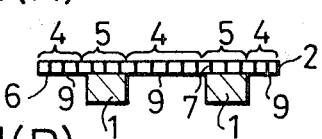
Figure 1P:
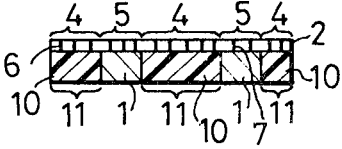

In the next step illustrated in FIG. 1J, the reverse side of the aluminum substrate 1 is coated with a photosensitive resin film 8 in the same manner as the step of gi. 1C. Thereafter, the film 8 and the aluminum substrate 1 undergo photoresist removal and etching processes to form a pattern 9 in alignment with the insulating layer 4 or the negative pattern 2c. In FIG. 1N, remaining portions 8a of photosensitive resin film are removed in the same process as the step of FIG. 1F. In the final step shown in FIG. 1P, the pattern 9 formed by the step of FIG. 1M is filled with an insulating material 10 of synthetic resin to form an insulating layer 11. Upon completion of the insulation layer 11, the contact electrodes of the conductive layer 5 are isolated by the insulation layer 11 against electrical connection through the aluminum substrate 1. In this manner, a circuit board in the form of a code disk as shown in FIG. 3 is fabricated.

Since the crystals 2a with the cells 2b therein of the alumite film 2 are quite small and closely arranged together, contactors (not shown) are allowed to slide simultaneously on a number of cells 2b respectively on the contacts 5a through 5e to contact the masses 7 of gold which are filled in the cells 2b and projecting slightly out of the upper ends $2b_1$ thereof. Therefore, the contactors are reliably brought into electrical contact with the contacts 5a through 5e during operation. The masses 7 of gold filled in the celles 2b are protected thereby against wear, with the result that the circuit board can endure for a prolonged period of operation. Since the negative patterns are formed by photoetching, a minute and precise circuit pattern can be fabricated. A code disk thus formed is much smaller in size than conventional code disks. The contacts 5a through 5e of the conductive layer 5 which are deposited on the aluminum substrate 1 are isolated by the insulating layer 11 against electric conduction therebetween, so that the contactors may comprise branches of a single metal plate for picking up code signals from the code disk.

The nonconductive and conductive materials filled in the cells 2b in the alumite film 2 should not be interpreted as being limited to the illustrated embodiment, and the circuit pattern may be designed as desired.

Although a certain preferred embodiment has been shown and described, it should be understood that many changes and modifications may be made therein without departing from the scope of the appended claims.

What is claimed is:

1. A method of making a circuit board having a conductive pattern adapted to be engaged by contractors, including:
    forming a layer of an aluminum oxide having crystals with open cells on the surface of an aluminum substrate;
    forming a film of photosensitive material on said layer of aluminum oxide;
    removing portions of the film of photosensitive material from said aluminum oxide layer in a pattern corresponding to said conductive pattern;
    filling the open cells of the aluminum oxide exposed by said removing step with either a conductive material or a non-conductive material;
    removing the remaining portions of the film of photosensitive material from said aluminum oxide layer; and
    filling the open cells of the aluminum oxide exposed by removing said remaining portions to the film of photosensitive material with the other of said conductive or non-conductive material to form a pattern of conductive and non-conductive areas on said aluminum oxide layer.

2. A method according to claim 1, including the further steps of:
    forming a second film of photosensitive material on the surface of said aluminum substrate opposite from the surface having the aluminum oxide layer;
    removing the portions of said second film and the portions of said substrate underlying the portions of said aluminum oxide having its open cells filled with a non-conductive material to form vacant spaces; and
    filling said vacant spaces with a non-conductive material.

3. A method of fabricating a circuit board, comprising the steps of:
    (a) depositing on alumite film composed of crystals having cells on a surface of an aluminum substrate;
    (b) depositing a photosensitive resin film on said alumite film;
    (c) removing portions of said photosensitive resin film to form a negative pattern of a desired circuit configuration;
    (d) filling an electrically nonconductive material in the cells in the alumite film in said negative pattern;
    (e) removing the remaining photosensitive resin film from said alumite film; and
    (f) filling an electrically conductive material in the remaining empty cells in the alumite film.

4. A method according to claim 1, including, subsequent to the step (f), the steps of:
    (g) depositing a photosensitive resin film on another surface of said aluminum substrate which is opposite to said surface on which the alumite film has been deposited;
    (h) photoetching said photosensitive resin film deposited in the step (g) and said another surface of said aluminum substrate to remove portions thereof in a pattern aligned with said negative pattern;
    (i) removing the remaining photosensitive resin film; and
    (j) filling an electrically nonconductive material in said pattern formed on said aluminum substrate in the step (h).

5. A circuit board having a conductive pattern adapted to be engaged by contactors and made by:
    forming a layer of an aluminum oxide having crystals with open cells on the surface of an aluminum substrate;
    forming a film of photosensitive material on said layer of aluminum oxide;
    removing portions of the film of photosensitive material from said aluminum oxide layer in a pattern corresponding to said conductive pattern;
    filling the open cells of the aluminum oxide exposed by said removing step with either a conductive material or a non-conductive material;
    removing the remaining portions of the film of photosensitive material from said aluminum oxide layer; and
    filling the open cells of the aluminum oxide exposed by removing said remaining portions to the film of photosensitive material with the other of said conductive or non-conductive material to form a pattern of conductive and non-conductive areas on said aluminum oxide layer.

6. A circuit board according to claim 1, made by the further steps of:
    forming a second film of photosensitive material on the surface of said aluminum substrate opposite from the surface having the aluminum oxide layer;
    removing the portions of said second film and the portions of said substrate underlying the portions of said aluminum oxide having its open cells filled with a non-conductive material to form vacant spaces; and
    filling said vacant spaces with a non-conductive material.

* * * * *